United States Patent
de Larios et al.

(10) Patent No.: US 7,441,299 B2
(45) Date of Patent: Oct. 28, 2008

(54) APPARATUSES AND METHODS FOR CLEANING A SUBSTRATE

(75) Inventors: John M. de Larios, Palo Alto, CA (US); Aleksander Owczarz, San Jose, CA (US); Alan Schoepp, Ben Lomond, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 100 days.

(21) Appl. No.: 10/816,337

(22) Filed: Mar. 31, 2004

(65) Prior Publication Data

US 2005/0133061 A1 Jun. 23, 2005

Related U.S. Application Data

(63) Continuation-in-part of application No. 10/746,114, filed on Dec. 23, 2003.

(51) Int. Cl.
*B08B 11/02* (2006.01)

(52) U.S. Cl. .............................. 15/77; 134/902; 15/88.3; 15/102; 15/302

(58) Field of Classification Search .................. 15/77, 15/88.2–88.3, 102, 50.3, 52.1, 302, 308; 134/902
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,205,911 A * | 6/1980 | Dole | 399/355 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | |
| 4,849,027 A | 7/1989 | Simmons | 134/22 |

(Continued)

FOREIGN PATENT DOCUMENTS

DE 40-38-587 6/1992

(Continued)

OTHER PUBLICATIONS

Computer generated English translation of JP 5-15857.*

(Continued)

*Primary Examiner*—Laura C Guidotti
(74) *Attorney, Agent, or Firm*—Martine Penilla & Gencarella, LLP (57) ABSTRACT

An apparatus for use in processing a substrate includes a brush enclosure extending over a length. The brush enclosure is configured to be disposed over a surface of the substrate and has an open region that is configured to be disposed in proximity to the substrate. The open region extends over the length of the brush enclosure and enables foam from within the brush enclosure to contact the surface of the substrate. A substrate cleaning system and method for cleaning a substrate are also described.

19 Claims, 7 Drawing Sheets

U.S. PATENT DOCUMENTS

| | | | |
|---|---|---|---|
| 4,911,761 A | 3/1990 | McConnell et al. ............ 134/11 |
| 4,962,776 A | 10/1990 | Liu et al. ...................... 134/11 |
| 5,000,795 A | 3/1991 | Chung et al. .................. 134/37 |
| 5,048,549 A * | 9/1991 | Hethcoat ................. 134/122 R |
| 5,102,777 A | 4/1992 | Lin et al. ..................... 430/331 |
| 5,105,556 A | 4/1992 | Kurokawa et al. ............. 34/12 |
| 5,113,597 A | 5/1992 | Sylla ............................. 34/22 |
| 5,175,124 A | 12/1992 | Winebarger ................. 437/180 |
| 5,181,985 A | 1/1993 | Lampert et al. ............. 156/635 |
| 5,226,969 A | 7/1993 | Watanabe et al. .............. 134/7 |
| 5,242,669 A | 9/1993 | Flor ............................ 423/465 |
| 5,271,774 A | 12/1993 | Leenaars et al. |
| 5,288,332 A | 2/1994 | Pustilnik et al. ............... 134/27 |
| 5,301,387 A * | 4/1994 | Thomas et al. ................. 15/322 |
| 5,306,350 A | 4/1994 | Hoy et al. ................. 134/22.14 |
| 5,336,371 A | 8/1994 | Chung et al. .............. 156/659.1 |
| 5,415,191 A | 5/1995 | Mashimo et al. .......... 134/102.1 |
| 5,417,768 A | 5/1995 | Smith et al. ................... 134/10 |
| 5,464,480 A | 11/1995 | Matthews |
| 5,472,502 A | 12/1995 | Batchelder .................. 118/52 |
| 5,494,526 A | 2/1996 | Paranjpe ....................... 134/1 |
| 5,498,293 A | 3/1996 | Ilardi et al. ..................... 134/3 |
| 5,656,097 A | 8/1997 | Olesen et al. .................. 134/1 |
| 5,660,642 A | 8/1997 | Britten ......................... 134/30 |
| 5,705,223 A | 1/1998 | Bunkofske |
| 5,800,626 A | 9/1998 | Cohen et al. ................. 134/1.3 |
| 5,858,283 A | 1/1999 | Burris |
| 5,900,191 A | 5/1999 | Gray et al. |
| 5,904,156 A | 5/1999 | Advocate, Jr. et al. ......... 134/2 |
| 5,908,509 A | 6/1999 | Olesen et al. ................. 134/1.3 |
| 5,911,837 A | 6/1999 | Matthews ...................... 134/2 |
| 5,932,493 A | 8/1999 | Akatsu et al. ............... 438/745 |
| 5,944,581 A | 8/1999 | Goenka ......................... 431/39 |
| 5,944,582 A | 8/1999 | Talieh ........................... 451/41 |
| 5,945,351 A | 8/1999 | Mathuni |
| 5,951,779 A | 9/1999 | Koyanagi et al. .............. 134/2 |
| 5,964,954 A | 10/1999 | Matsukawa et al. ............ 134/6 |
| 5,964,958 A | 10/1999 | Ferrell et al. .................. 134/26 |
| 5,968,285 A | 10/1999 | Ferrell et al. .................. 134/26 |
| 5,997,653 A | 12/1999 | Yamasaka |
| 6,048,409 A | 4/2000 | Kanno et al. .................. 134/34 |
| 6,049,996 A | 4/2000 | Freeman et al. ............... 34/362 |
| 6,081,650 A | 6/2000 | Lyons et al. ................... 386/95 |
| 6,090,217 A | 7/2000 | Kittle ........................... 134/11 |
| 6,092,538 A | 7/2000 | Arai et al. .................... 134/1.3 |
| 6,152,805 A | 11/2000 | Takahashi .................... 451/36 |
| 6,158,445 A | 12/2000 | Olesen et al. ................. 134/1.3 |
| 6,167,583 B1 * | 1/2001 | Miyashita et al. ............. 15/77 |
| 6,228,563 B1 | 5/2001 | Starove et al. ............... 430/327 |
| 6,267,125 B1 | 7/2001 | Bergman et al. |
| 6,270,584 B1 | 8/2001 | Ferrell et al. .................. 134/26 |
| 6,272,712 B1 | 8/2001 | Gockel et al. |
| 6,276,459 B1 | 8/2001 | Herrick et al. |
| 6,286,231 B1 | 9/2001 | Bergman et al. .............. 34/410 |
| 6,290,780 B1 * | 9/2001 | Ravkin ........................... 134/6 |
| 6,296,715 B1 | 10/2001 | Kittle ............................ 134/2 |
| 6,319,801 B1 | 11/2001 | Wake et al. .................. 438/585 |
| 6,352,082 B1 | 3/2002 | Mohindra et al. .......... 134/25.4 |
| 6,386,956 B1 | 5/2002 | Sato et al. ..................... 451/57 |
| 6,398,975 B1 | 6/2002 | Mertens et al. |
| 6,401,734 B1 | 6/2002 | Morita et al. ............... 134/153 |
| 6,423,148 B1 | 7/2002 | Aoki ............................. 134/3 |
| 6,439,247 B1 | 8/2002 | Kittle |
| 6,457,199 B1 | 10/2002 | Frost et al. ..................... 15/77 |
| 6,491,043 B2 | 12/2002 | Mohindra et al. .......... 134/25.4 |
| 6,491,764 B2 | 12/2002 | Mertens et al. |
| 6,493,902 B2 | 12/2002 | Lin ............................. 15/302 |
| 6,513,538 B2 | 2/2003 | Chung et al. ................ 134/1.2 |
| 6,514,921 B1 | 2/2003 | Kakizawa ................... 510/175 |
| 6,527,870 B2 | 3/2003 | Gotikis .......................... 134/6 |
| 6,532,976 B1 | 3/2003 | Huh et al. .................... 134/111 |
| 6,537,915 B2 | 3/2003 | Moore et al. ................ 438/692 |
| 6,562,726 B1 | 5/2003 | Torek et al. ................. 438/745 |
| 6,576,066 B1 | 6/2003 | Namatsu ....................... 134/30 |
| 6,594,847 B1 * | 7/2003 | Krusell et al. ................. 15/102 |
| 6,616,772 B2 | 9/2003 | de Larios et al. .............. 134/21 |
| 6,643,893 B2 * | 11/2003 | Momonoi et al. .............. 15/303 |
| 6,733,596 B1 | 5/2004 | Mikhaylichenko et al. ...... 134/6 |
| 6,787,473 B2 | 9/2004 | Andreas ...................... 438/692 |
| 6,797,071 B2 | 9/2004 | Kittle .......................... 134/11 |
| 6,802,911 B2 | 10/2004 | Lee et al. ...................... 134/28 |
| 6,846,380 B2 | 1/2005 | Dickinson et al. ....... 156/354.31 |
| 6,851,435 B2 | 2/2005 | Mertens et al. ............. 134/99.1 |
| 6,874,516 B2 | 4/2005 | Matsuno et al. ............. 134/148 |
| 6,896,826 B2 | 5/2005 | Wojtczak et al. ............ 252/79.1 |
| 6,927,176 B2 | 8/2005 | Verhaverbeke et al. ...... 438/745 |
| 6,946,396 B2 | 9/2005 | Miyazawa et al. .......... 438/689 |
| 6,951,042 B1 | 10/2005 | Mikhaylichenko et al. ..... 15/77 |
| 7,122,126 B1 | 10/2006 | Fuentes ...................... 216/689 |
| 2002/0094684 A1 | 7/2002 | Hirasaki et al. |
| 2002/0112312 A1* | 8/2002 | Lin .............................. 15/302 |
| 2002/0121290 A1 | 9/2002 | Tang et al. ..................... 134/6 |
| 2002/0185164 A1* | 12/2002 | Tetsuka et al. .............. 134/148 |
| 2002/0195121 A1 | 12/2002 | Kittle |
| 2003/0075204 A1 | 4/2003 | De Larios et al. |
| 2003/0148903 A1 | 8/2003 | Bargaje et al. .............. 510/130 |
| 2003/0171239 A1 | 9/2003 | Patel et al. |
| 2003/0226577 A1 | 12/2003 | Orll et al. ..................... 134/1.3 |
| 2004/0002430 A1 | 1/2004 | Verhaverbeke .............. 510/175 |
| 2004/0053808 A1 | 3/2004 | Raehse et al. ............... 510/447 |
| 2004/0134515 A1 | 7/2004 | Castrucci ....................... 134/2 |
| 2004/0159335 A1 | 8/2004 | Montierth et al. ............. 134/10 |
| 2004/0163681 A1 | 8/2004 | Verhaverbeke ............... 134/28 |
| 2004/0261823 A1 | 12/2004 | de Larios ..................... 134/31 |
| 2005/0045209 A1 | 3/2005 | Tan ............................. 134/18 |
| 2005/0132515 A1* | 6/2005 | Boyd et al. ..................... 15/77 |
| 2005/0133060 A1 | 6/2005 | de Larios et al. ............. 134/1.3 |
| 2005/0133061 A1 | 6/2005 | de Larios et al. ............... 134/6 |
| 2005/0159322 A1 | 7/2005 | Min et al. .................... 510/175 |
| 2005/0176606 A1 | 8/2005 | Konno et al. ................ 510/175 |
| 2005/0183740 A1 | 8/2005 | Fulton et al. ................... 134/3 |
| 2006/0201267 A1 | 9/2006 | Liu .............................. 74/89.2 |
| 2006/0283486 A1 | 12/2006 | de Larios et al. .............. 134/34 |
| 2006/0285930 A1 | 12/2006 | de Larios et al. ............ 406/197 |
| 2007/0000518 A1 | 1/2007 | Korolik et al. |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | S62-119543 A | 5/1987 |
| JP | 63-077510 | 4/1988 |
| JP | 5-15857 * | 1/1993 |
| JP | 06-177101 | 6/1994 |
| JP | 07-006993 | 1/1995 |
| JP | H11-350169 A | 12/1999 |
| JP | 2001-064688 | 3/2001 |
| JP | 2002-66475 | 3/2002 |
| JP | 2002-280330 A | 9/2002 |
| JP | 2002-309638 A | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO 00/59006 A | 10/2000 |
| WO | WO-01/12384 | 2/2001 |
| WO | WO-02/101795 | 12/2002 |

| WO | WO-2005/006424 | 1/2005 |
| WO | WO 2005/064647 | 7/2005 |

OTHER PUBLICATIONS

Kirkpatrick et al., "Advanced Wafer-Cleaning Evolution," Solid State Technology, May 2003, www.solid-state.com.

Weaire et al., "The Physics of Foams," Department of Physics, Trinity College, Dublin, 1999.

Kittle et al., "Photoresist Removal Using Aqueous Foam," found on the internet: http://www.aquafoam.com/papers/A2C2photoresist.pdf., 2001.

Kittle et al., "Aqueous Foam Drying and Cleaning of Semiconductor Wafers," found on the internet: http://www.aquafoam.com/papers/SCCPresentation.pdf.

Kittle et al., "Foam Wafer Cleaning—Experimental Proof of Concept <http://www.aquafoam.com/papers/Removalall.pdf>".

Kittle, et al., "Particulate Removal Using a Foam Medium <http://www.aquafoam.com/papers/particulate.pdf>".

Kittle, "Removing Particles with a Foam Medium <http://www.aquafoam.com/papers/A2C2foammedium.pdf>," A2C2, p. 11-15, Jan. 2002.

Kittle et al., "Photoresist Residue Removal Using Aqueous Foam Proof of Concept Experiments <http://www.aquafoam.com/papers/Proof-11MB.pdf>" <papers/A2C2photoresist.pdf>, pp. 13-17, May 2002.

Kittle et al., "Semiconductor Wafer Cleaning and Drying Using a Foam Medium" <http://www.aquafoam.com/papers/NWCWG.pdf> Sematech Novel Wafer Cleans Working Group Meeting, Internet Presentation, Nov. 13, 2001.

Hunter, "Introduction to Modern Colloid Science," Oxford University Press, Feb. 1994.

Lester "Is Foam Wafer Cleaning and Drying the Future? " <http://www.aquafoam.com/papers/SCI0202.pdf> Semiconductor International, 25, #2 (February), 42 (2002).

Aubert, JM et al.; "Aqueous foams"; Scientific America; 1986, 74-82, 254.

U.S. Appl. No. 11/639,752, filed Dec. 15, 2006, Boyd et al.

U.S. Appl. No. 11/743,283, filed May 2, 2007, Freer et al.

* cited by examiner

APPARATUSES AND METHODS FOR CLEANING A SUBSTRATE

CROSS-REFERENCE TO RELATED APPLICATIONS

This application claims priority under 35 U.S.C. § 120 as a continuation-in-part of U.S. application Ser. No. 10/746,114, filed Dec. 23, 2003, the disclosure of which is incorporated herein by reference.

This application also relates to U.S. application Ser. No. 10/608,871, filed Jun. 27, 2003, the disclosure of which is incorporated herein by reference.

BACKGROUND OF THE INVENTION

1. Field of the Invention

The present invention relates to semiconductor manufacturing and, more particularly, to apparatuses and methods for use in processing a substrate.

2. Description of the Related Art.

In the fabrication of semiconductor devices, there is a need to perform substrate (e.g., semiconductor wafer) cleaning. For example, the process of manufacturing electronic devices on semiconductor wafers involves a complex process of depositing and removing a number of layers. Typically, patterning of layer materials includes the application of an organic photoresist onto the semiconductor wafer. After plasma chemistry etches a target material, the semiconductor wafer needs to be cleaned to remove the organic photoresist. If the organic photoresist is not removed, the organic photoresist will contaminate the semiconductor wafer resulting in damage to the electronic devices on the semiconductor wafer. In addition, after a chemical mechanical polishing (CMP) operation, residual particles or films are left on the surface of the semiconductor wafer. Similarly, these residual particles or films may cause defects such as scratches on the wafer surface which may cause devices on the wafer to become inoperable. To avoid damaging the devices, the wafer also needs to be cleaned after the CMP operation. As such, cleaning operations define a very critical step that is repeated many times throughout the process of fabricating semiconductor devices.

Figure 1:
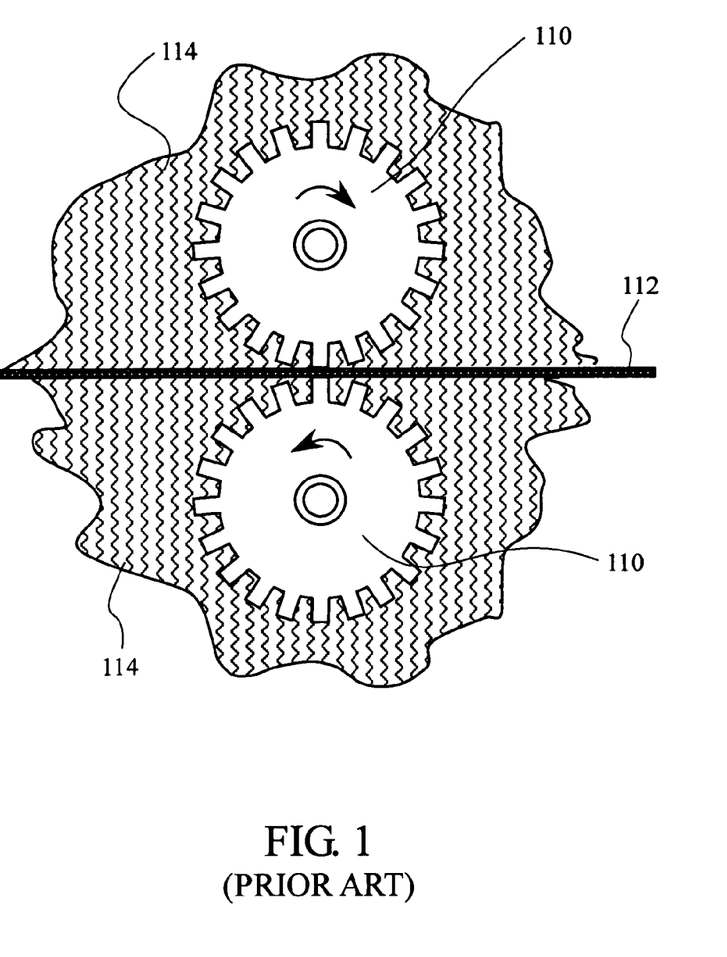
FIG. 1 is a simplified side view of a conventional system used to clean semiconductor wafers.

FIG. 1 is a simplified side view of a conventional system used to clean semiconductor wafers. The cleaning system includes two brushes 110 configured to receive semiconductor wafer 112 between the brushes. Foam 114 is supplied to the surface of semiconductor wafer 112 and brushes 110 rotate to scrub the surface of the semiconductor wafer to remove particles and film. The problem with applying foam 114 in an open environment is that the foam haphazardly grows around brushes 110 and cannot be directed to a particular surface area of semiconductor wafer 112. In other words, the flow of foam 114 is difficult to control when applied in an open environment. Furthermore, different properties of foam 114 result in different cleaning capabilities, and the properties of foam 114 are also difficult to control when applied in the open environment. The application of foam 114 in the open environment is also wasteful as a large quantity of the foam is needed to insure a uniform distribution across the surface of semiconductor wafer 112.

In view of the foregoing, there is a need to conserve the use of foam and to control the physical properties and flow of foam when applied on the surface of the semiconductor wafer.

SUMMARY OF THE INVENTION

Broadly speaking, the present invention fills these needs by providing apparatuses and methods for cleaning a substrate. It should be appreciated that the present invention can be implemented in numerous ways, including as a process, an apparatus, a system, computer readable media, or a device. Several inventive embodiments of the present invention are described below.

In accordance with a first aspect of the present invention, an apparatus for use in processing a substrate is provided. The apparatus includes a brush enclosure extending over a length. The brush enclosure is configured to be disposed over a surface of the substrate and has an open region that is configured to be disposed in proximity to the substrate. The open region extends over the length of the brush enclosure and enables foam from within the brush enclosure to contact the surface of the substrate.

In accordance with a second aspect of the present invention, a brush enclosure for use in processing a substrate is provided. The brush enclosure includes an elongated enclosure configured to enclose a brush. The elongated enclosure is configured to be disposed above a surface of the substrate and has opposite ends that defines a length. Furthermore, the elongated enclosure has an open region along the length of the elongated enclosure. The open region is configured to be disposed above the surface of the substrate and enables a surface of the brush to make contact with the surface of the substrate.

In accordance with a third aspect of the present invention, a substrate cleaning system is provided. The system includes a first brush enclosure and a first brush partially enclosed within the first brush enclosure. The first partially enclosed brush is configured to be disposed above a surface of a substrate. Additionally, the system includes a first drive roller and a second drive roller whereby the first and second drive rollers are configured to receive an edge of the substrate to support and rotate the substrate when placed below the first partially enclosed brush.

In accordance with a fourth aspect of the present invention, a method for cleaning a substrate is provided. In this method, foam is provided to a surface of the substrate. Next, the surface of the substrate is scrubbed with a brush. Pressure is then provided to the foam and the pressured foam is channeled to produce jammed foam. Brush scrubbing the surface of the substrate and channeling the pressured foam across the surface of the substrate facilitate particles to be removed from the surface of the substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is disclosed for apparatuses and methods for cleaning a substrate. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

The embodiments described herein provide a brush enclosure to enclose a brush and foam. In particular, the brush enclosure is configured to contain and to control the flow and physical properties of foam. As will be explained in more detail below, the geometry of the brush enclosure creates different cleaning effects within the brush enclosure.

Figure 2A:
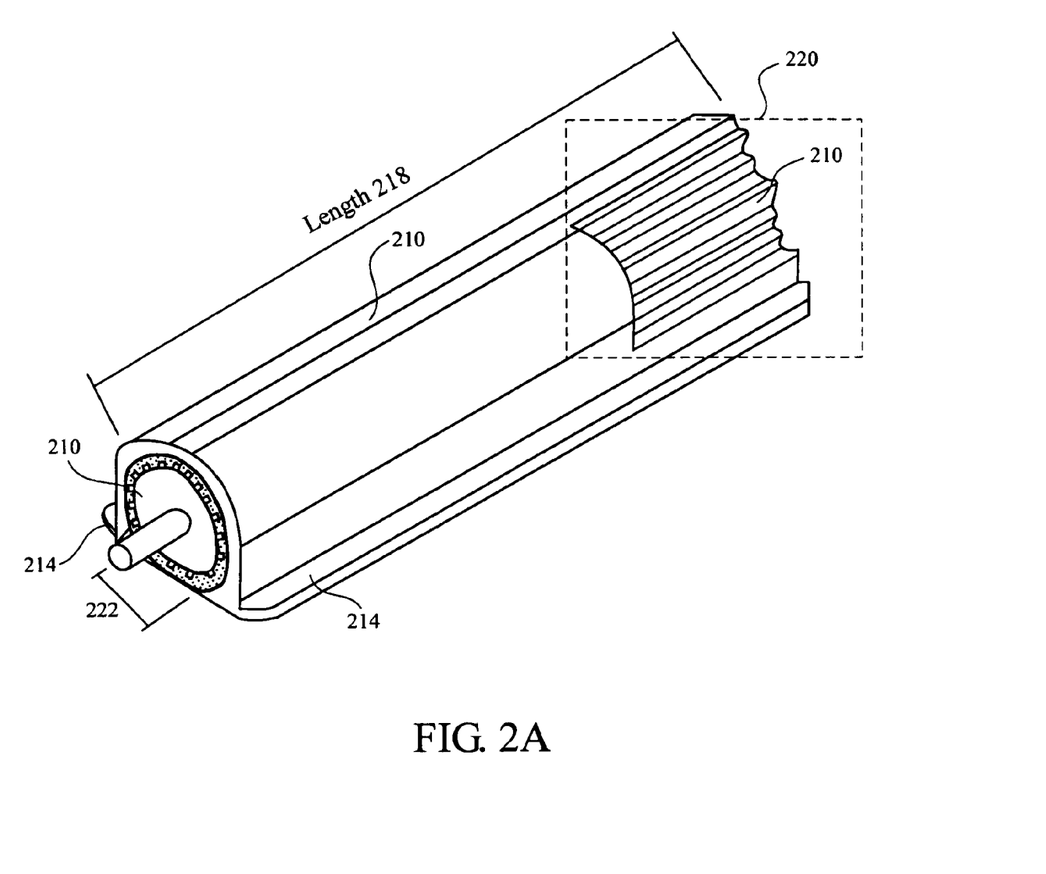
FIG. 2A is a perspective view of a brush partially enclosed within a brush enclosure, in accordance with one embodiment of the present invention.

FIG. 2A is a perspective view of brush 210 partially enclosed within brush enclosure 212, in accordance with one embodiment of the present invention. For illustrative purposes, brush enclosure 212 includes a cutout section in reference area 220 that shows brush 210 is partially enclosed within the brush enclosure. Brush 210 rotates to dislodge particles and to sweep the particles away from the surface of a substrate. Brush enclosure 212 may be configured to enclose any suitable brush 210 used in processing the substrate. For example, as shown FIG. 2A, an exemplary brush 210 has a spline geometry that includes a series of parallel, continuous raised strips at right angles to the curved brush surface. Another exemplary suitable brush 210 has a knobby geometry that includes a set of cylinders raised at right angles to the curved brush surface.

Brush enclosure 212 is an elongated member that extends over length 218. As shown in FIG. 2A, length 218 of brush enclosure 212 extends a length of brush 210. However, in another embodiment, length 218 of brush enclosure 212 may be shorter or longer than the length of brush 210. FIG. 2A shows brush enclosure 212 having a tubular shape, in accordance with one embodiment of the present invention. However, brush enclosure 212 may not necessarily have a "tubular" shape, but may be any suitable configuration, shape and/or size such as, for example, elongated members with rectangular cross sections, elliptical cross sections, triangular cross sections, circular cross sections, etc., as long as the brush enclosure may be configured in a manner that would enable brush 210 to be partially enclosed.

As will be explained in more detail below, brush enclosure 212 also includes open region 222 and, in one embodiment, additionally includes two opposing flanges 214 that extend along length and side of open region 222. Brush enclosure 212 is comprised of a chemically inert material. Exemplary chemically inert materials include plastic, DELRIN™ (polyoxymethylene) polyvinylidene fluoride (PVDF), polyethylene terepthalate (PET), etc.

As will be explained in more detail below, brush enclosure 212 also includes open region 222 and, in one embodiment, additionally includes two opposing flanges 214 that extend along length and side of open region 222. Brush enclosure 212 is comprised of a chemically inert material. Exemplary chemically inert materials include plastic, Delrin, polyvinylidene fluoride (PVDF), polyethylene terepthalate (PET), etc.

Figure 2B:
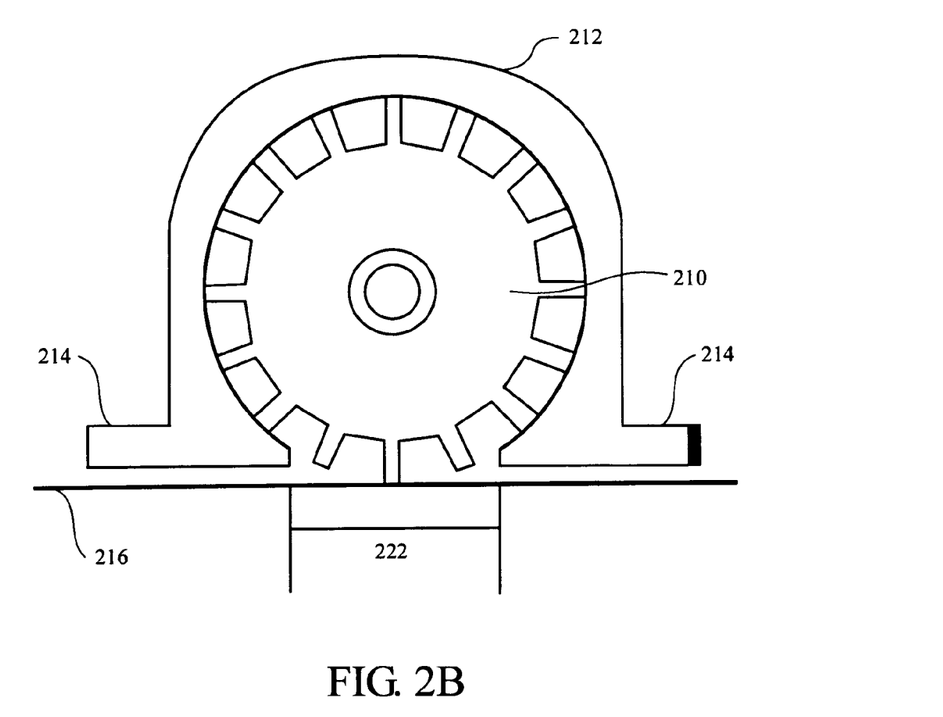
FIG. 2B is a side view of the brush and the brush enclosure shown in FIG. 2A, in accordance with one embodiment of the present invention.

FIG. 2B is a side view of brush 210 and brush enclosure 212 shown in FIG. 2A, in accordance with one embodiment of the present invention. Here, brush 210 that is partially enclosed within brush enclosure 212 is disposed above substrate 216. As shown in FIG. 2B, brush enclosure 212 includes open region 222 and two opposing flanges 214. Open region 222 is configured to be disposed in proximity to a surface of substrate 216 and allows a surface of brush 210 to make contact with the surface of the substrate. In one embodiment, open region 222 extends along complete length of brush enclosure 212. In another embodiment, length of open region 222 is less than the length of brush enclosure 212.

Additionally, flanges 214 extend radially outward from an outer surface of brush enclosure 212. Each flange 214 extends along the length and along a side of open region 222. In one embodiment, each flange 214 extends along the complete length of open region 222. In another embodiment, the length of each flange 214 is less than the length of open region 222. Each flange 214 defines a surface that is substantially parallel to the surface of substrate 216. As used herein, the term "substantially" means that the angle between the surface of each flange 214 and surface of substrate 216 vary from about 0 degrees to about ±45 degrees. As shown in FIG. 2B, brush enclosure 212 includes two flanges 214 on opposite ends. However, in another embodiment, brush enclosure 212 may have one flange 214 instead of two flanges.

Figure 3:
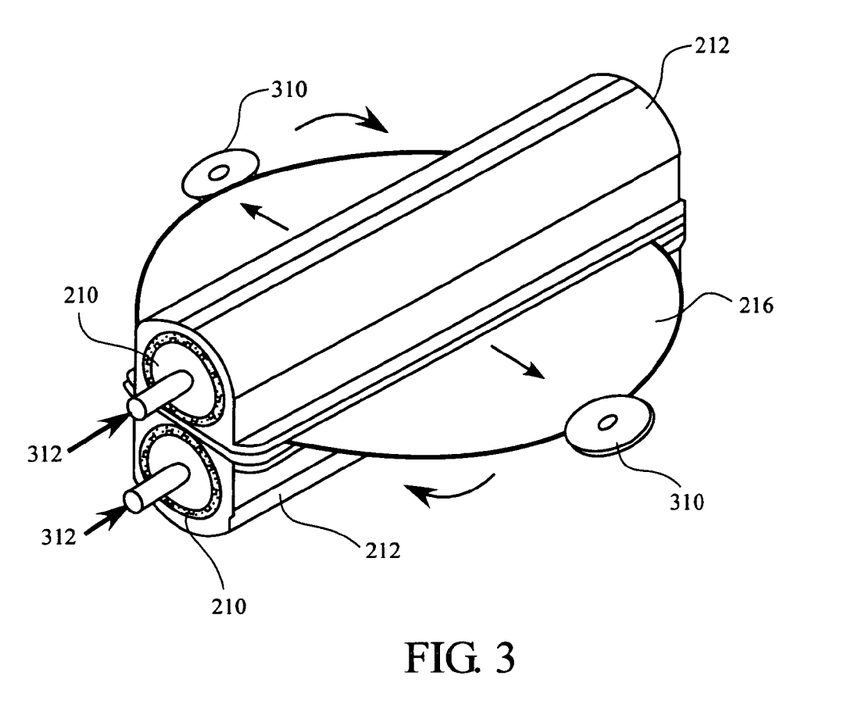
FIG. 3 is a perspective view of a substrate cleaning system, in accordance with one embodiment of the present invention.

FIG. 3 is a perspective view of a substrate cleaning system, in accordance with one embodiment of the present invention. As shown in FIG. 3, substrate cleaning system includes two brushes 210 partially enclosed in brush enclosures 212, two drive rollers 310, and substrate 216. Drive rollers 310 receive an edge of substrate 216 to support and rotate the substrate. Partially enclosed brushes 210 are oriented relative to each other such that substrate 216 is received between the brushes. FIG. 3 shows the use of two partially enclosed brushes 210 to clean substrate 216. However, in another embodiment, one partially enclosed brush 210 may be used to clean substrate 216. Additionally, in still another embodiment, the substrate cleaning system includes two brushes 210, but with one brush partially enclosed in brush enclosure 212 and the second brush not enclosed within the brush enclosure.

As will be explained in more detail below, the substrate cleaning system uses foam to clean substrate 216. A number of bubbles collectively join to define foam. A bubble is a two-phase system is which gases are enclosed by liquids. The liquids define a membrane or film that holds and surrounds the gases. In foam, the liquids also exist in the space between the bubbles. In one embodiment, each brush 210 is made of a high-porosity foam such as polyvinyl alcohol (PVA) and can be used as foam generator and foam applicator. To generate foam within brush enclosures 212, gases and liquids are supplied through conduits 312 under pressure to brushes 210. The gases and liquids mix within the porous PVA brushes 210 in such a manner to generate foam. In another embodiment, pre-generated foam is supplied through conduits 312 to brushes 210. To spread foam across the entire surface of substrate 216, drive rollers 310 rotate substrate 216. Alternatively, brushes 210 can move across the surface of substrate 216 to spread foam. Foam may additionally be spread by a combination of rotating substrate 216 and moving brushes 210 across the surface of the substrate.

Figure 4:
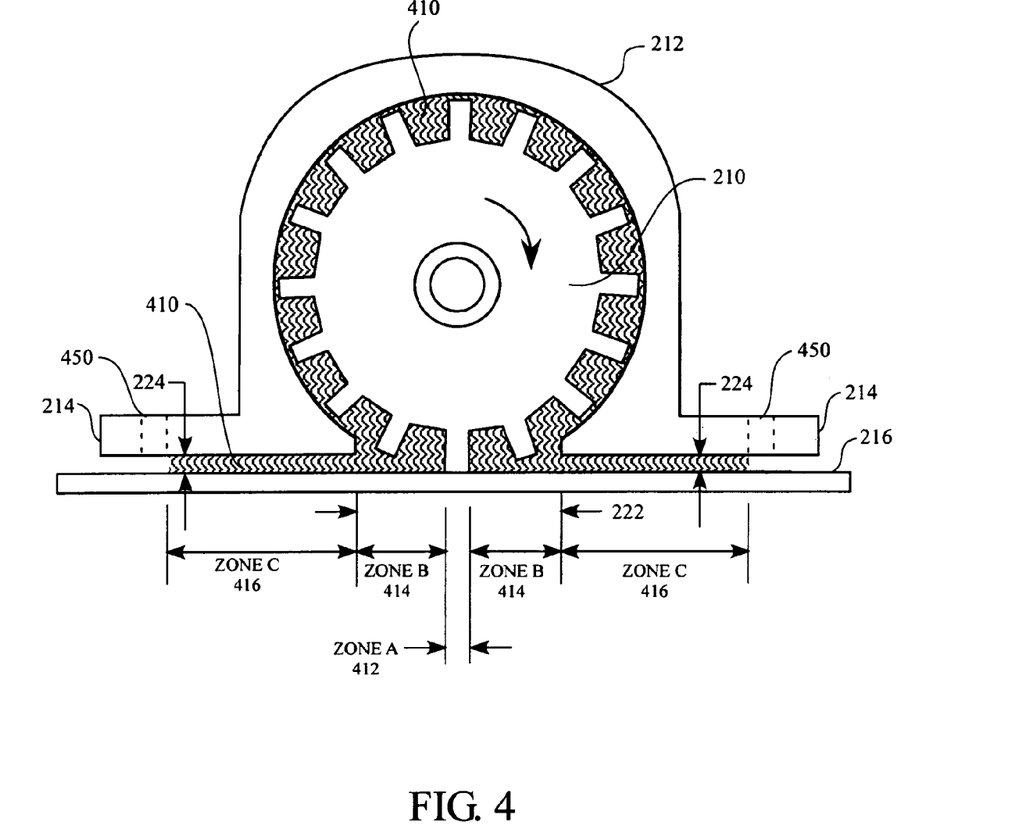
FIG. 4 is a side view of a partially enclosed brush with foam, in accordance with one embodiment of the present invention.

FIG. 4 is a side view of partially enclosed brush 210 with foam 410, in accordance with one embodiment of the present invention. As shown in FIG. 4, brush 210 is disposed above substrate 216 and brush enclosure 212 partially encloses the brush and foam 410. The enclosure of brush 210 and foam 410 creates different zones 412, 414, and 416 of cleaning the surface of substrate 216. Within the area defined as Zone A 412, the surface of brush 210 contacts the surface of substrate 216. As brush 210 rotates, the brush physically scrubs the surface of substrate 216 to remove particles. As a result, within Zone A 412, the surface of substrate 216 is cleaned by scrubbing.

On the other hand, within the areas defined as Zone B 412, the surface of substrate 216 is primarily cleaned by chemical treatment with foam 410. Open region 222 of brush enclosure 212 allows foam 410 from within the brush enclosure to contact the surface of substrate 216. As discussed above, foam 410 is comprised of liquids and bubbles of gases. When bubbles within foam 410 rupture on the surface of substrate 216, the rupture releases gases and the gases and liquids are placed in direct contact with surface of substrate 216. A chemical reaction between the gases, liquids, and surface of substrate 216 occurs thereby facilitating removal of particles and layer of material (e.g., organic material layer) from the surface of the substrate.

To chemically treat the surface of substrate 216 with foam 410, the gas is preferably a gas or any combination of gases that will chemically react or will facilitate a chemical reaction when placed in direct contact with another material. Exemplary gases that react with contamination include ozone ($O_3$), oxygen ($O_2$), hydrochloric acid (HCl) and hydrofluoric acid (HF), and non-reactive gasses such as nitrogen ($N_2$) and argon (Ar). The gas may also include any combination of gases such as: ozone ($O_3$) and nitrogen ($N_2$); ozone ($O_3$) and argon (Ar); ozone ($O_3$), oxygen ($O_2$) and nitrogen ($N_2$); ozone ($O_3$), oxygen ($O_2$) and argon (Ar); ozone ($O_3$), oxygen ($O_2$), nitrogen ($N_2$) and argon (Ar); oxygen ($O_2$) and argon (Ar); oxygen ($O_2$) and nitrogen ($N_2$); and oxygen ($O_2$), argon (Ar) and nitrogen ($N_2$). An embodiment of the present invention uses ozone as gas because ozone, when combined with water, chemically reacts with an organic material on the surface of substrate 216. The organic material may be an organic photoresist material, which is commonly used in semiconductor photolithography operations. Nitrogen can be combined with ozone to increase the concentration of ozone in the bubbles.

The liquid used to generate foam 410 is a liquid or any combination of liquids that will chemically react or will facilitate a chemical reaction when placed in direct contact with another material. The liquid may be a semi-aqueous or aqueous solution of deionized water (DIW) containing suitable cleaning fluids. Examples of liquids include water ($H_2O$); deionized water (DIW); water ($H_2O$) and cleaning fluid; water ($H_2O$) and surfactant; water ($H_2O$), cleaning fluid, and surfactant; deionized water (DIW) and surfactant; and deionized water (DIW), cleaning fluid and surfactant. As discussed above, an embodiment of the present invention uses water as the liquid because water enables or facilitates the chemical reaction between ozone and an organic photoresist material. For more details on foam generation and cleaning substrate 216 using foam 410, reference may be made to a U.S. patent application Ser. No. 10/608,871 entitled "Method and Apparatus for Removing a Target Layer from a Substrate Using Reactive Gases," which is herein incorporated by reference.

Within the areas defined as Zone C 416, the surface of substrate 216 is primarily cleaned by the attraction of particles to the gas/liquid interfaces of bubbles. As shown in FIG. 4, the space between the surface of each flange 214 and surface of substrate 216 defines gap 224. Gap 224 is maintained to induce a non-Newtonian flow field. In one embodiment, dimension of gap 224 ranges from about 0.1 mm to about 5 mm. As used herein, the term "about" means that the specified dimension or parameter may be varied within an acceptable manufacturing tolerance for a given application. In one embodiment, the acceptable manufacturing tolerance is ±10%.

Pressure is applied to foam 410 within brush enclosure 212 and the foam is channeled into gap 224 (i.e., Zone C 416) to produce jammed foam. Jammed foam is produced by the application of force to compress foam 410. When compressed within gap 224, the bubbles within foam 410 deform in shape and rearrange into a more closely packed configuration. In effect, the pressure and geometry of gap 224 causes foam 410 to change from a meta-stable position to a more stable position within Zone C 416.

As pressure channels foam 410 within brush enclosure 212 through gap 224, shear force is created locally between the bubbles of jammed foam. The shear force causes the bubbles to move locally with relationship to each other. The local movements of bubbles caused by the shear force release bursts of energy, and this energy is transferred to the surface of substrate 216 to facilitate the removal of particles from the surface of the substrate. Specifically, the bubbles within the jammed foam want to be at a minimum energy state, where all the angles between the bubbles are approximately 120 degrees. When shear force causes a bubble at a minimum energy state to pass over another bubble, the angles between the bubbles change, and the change of angle results in a higher energy state. In effect, a change of angles between bubbles equates to a change of energy. Thus, the energy is released not by bubbles rupturing, but by the local rearrangement of bubbles within the jammed foam. For more details on the use of jammed foam to clean substrate 216, reference may be made to a U.S. patent application Ser. No. 10/746,114 entitled "Method and Apparatus for Cleaning Semiconductor Wafers Using Compressed and/or Pressurized Foams, Bubbles, and/or Liquids," which is herein incorporated by reference.

As shown in FIG. 4, brush enclosure 212 may additionally include removing conduits 450 located within flanges 214, in accordance with one embodiment of the present invention. Removing conduits 450 are configured to remove foam 410, liquid, particles, etc. from surface of substrate 216 by applying vacuum. In another embodiment, conduits 450 could also be configured to provide deionized water (DIW) and/or chemical rinse to facilitate foam removal. In still another embodiment, additional conduits 450 may supply an additional chemical and/or gas, such as isopropyl alcohol (IPA), to reduce the surface tension of liquids on the surface of water as a means of removing the liquid from the surface of substrate 216.

Figure 5A:
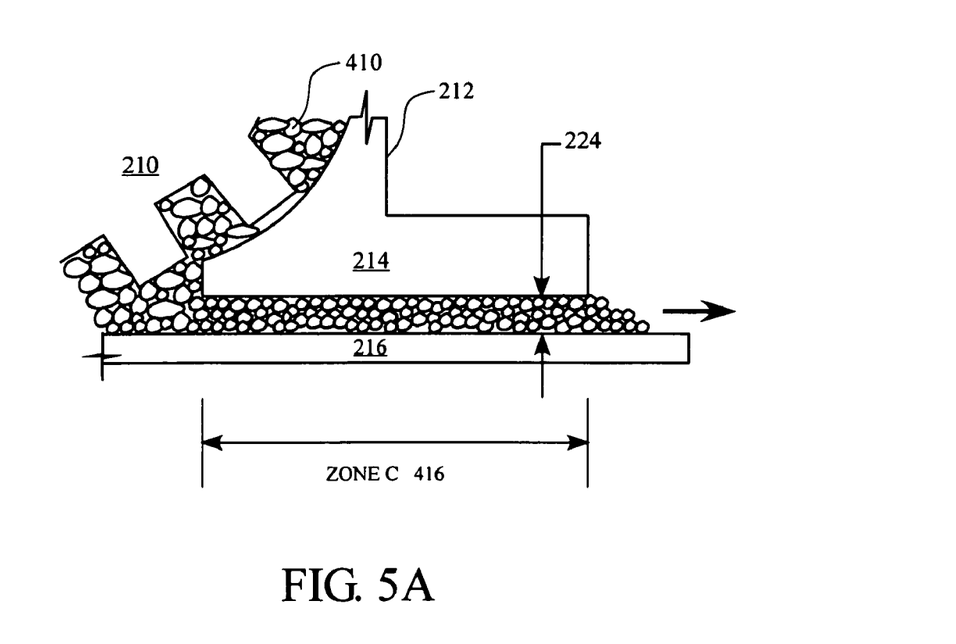
FIG. 5A is a magnified side view of the gap region shown in FIG. 4, in accordance with one embodiment of the present invention.
Figure 5B:
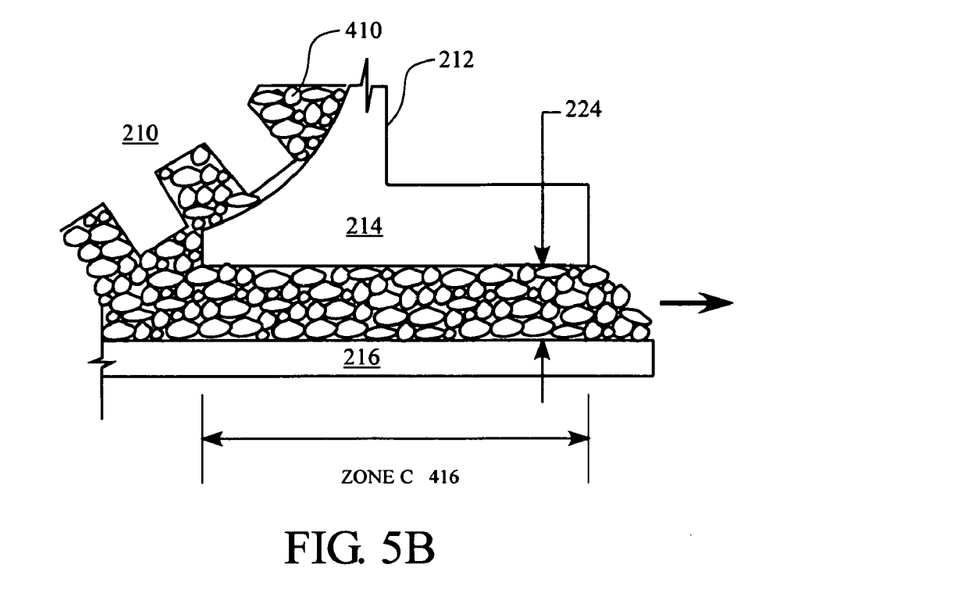
FIG. 5B is an alternative embodiment of the gap region shown in FIG. 5A.

FIGS. 5A and 5B are magnified side views of the gap region shown in FIG. 4, in accordance with one embodiment of the present invention. As shown in FIGS. 5A and 5B, gap region shows brush 210 disposed above substrate 216 partially enclosed within brush enclosure 212. Brush enclosure 212 includes flange 214 and the space between the surface of the flange and surface of substrate 216 defines gap 224. Different gap 224 geometries may be used to manipulate the mechanical properties and dimensions of foam 410 and the bubbles within the foam. The combination of changing the mechanical properties and chemical properties of foam 410 provides cleaning process flexibility by changing in-situ properties of the foam for different cleaning requirements. For instance, as shown in FIG. 5A, a small gap 224 results in small bubbles within the gap. Since gap 224 is small, pressure within brush enclosure 212 is large and, as a result, foam 410 exits gap 224 at a high velocity. The combination of smaller bubble size and high foam viscosity increases the shearing force between the bubbles. Higher shearing force results in larger energy transferred to surface of substrate 216 when bubbles within jammed foam locally rearrange.

On the other hand, as shown in FIG. 5B, a larger gap 224 results in larger bubbles within the gap. Since gap 224 is large, pressure within brush enclosure 212 is less and, as a result, foam 410 exits the gap at a lower velocity. The combination of larger bubble size and lower viscosity facilitates the removal of particles from vias and trenches. Since different gap geometries create different cleaning properties, the two flanges on opposite sides of brush enclosure 212 may be configured to have different geometries, in accordance with one embodiment of the present invention. For example, one flange 214 may be configured to have a small gap to create a higher shear force while the opposite flange 214 on the same brush enclosure 212 may be configured to have a larger gap to remove particles from vias and trenches. Thus, in this embodiment, brush enclosure 212 may be configured to satisfy two different cleaning requirements.

Figure 6:
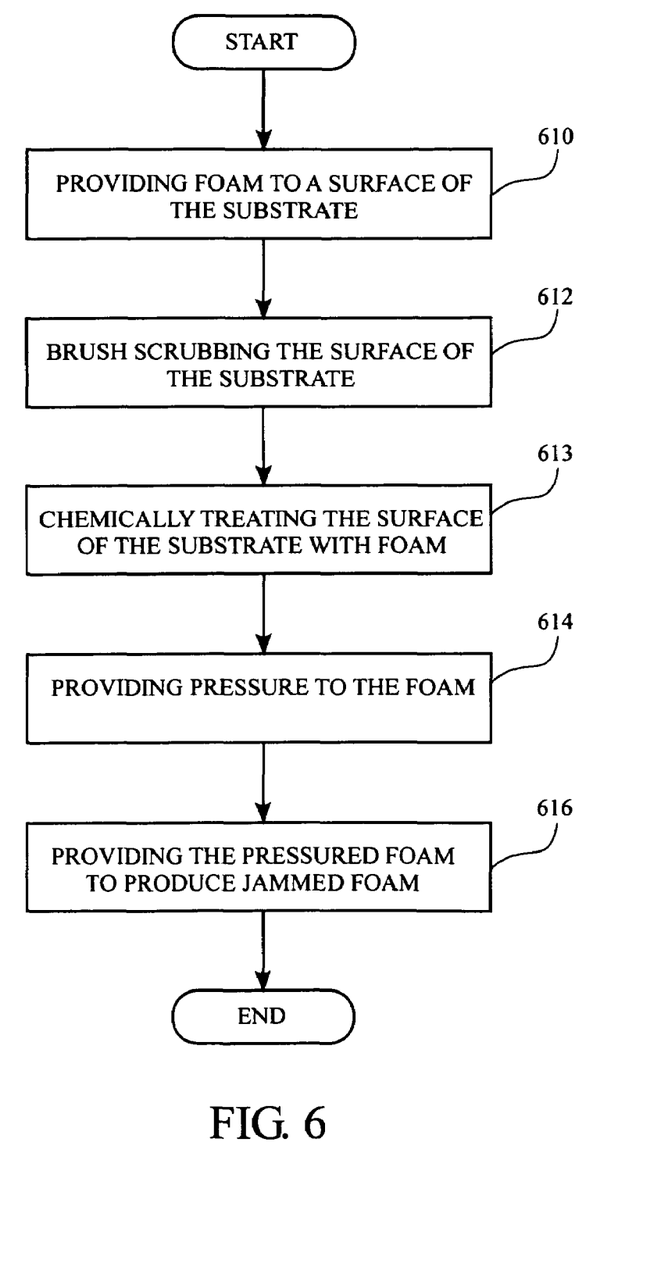
FIG. 6 is a flowchart diagram of the method operations for cleaning a substrate, in accordance with one embodiment of the present invention.

FIG. 6 is a flowchart diagram of the method operations for cleaning a substrate, in accordance with one embodiment of the present invention. Starting in operation 610, foam is provided to a surface of the substrate. At the area where a surface of a brush makes contact with a surface of the substrate, the surface of the substrate is physically scrubbed by the brush in operation 612. Simultaneously, within an area created by a brush enclosure that is between the area where the brush makes contact with the surface of the substrate and an area defined by a gap, the surface of the substrate is primarily cleaned by chemical treatment with foam in operation 613. As discussed above, the chemical treatment facilitates the removal of particles and films from the surface of the substrate by placing gases and liquids, through the rupture of bubbles within the foam, in direct contact with the surface of substrate. At the same time, pressure is provided to the foam in operation 614 and, as a result, the pressured foam is channeled to produce jammed foam in operation 616. In particular, the foam is channeled into a gap created by the brush enclosure. The gap is defined by a space between a surface of the brush enclosure (e.g., a flange) and the surface of the substrate. The pressure on the foam and geometry of the gap compress the foam to produce the jammed foam. The local rearrangement of bubbles within the jammed foam releases energy that facilitates the removal of particles and films from the surface of the substrate.

In sum, the above described invention provides apparatuses and methods for use in cleaning a substrate. The enclosure of foam reduces the amount of foam needed to cover a particular surface area of the substrate. Furthermore, the geometry of the brush enclosure can specifically direct the flow of foam and control the physical properties of foam to better facilitate the removal of particles and film from the surface of the substrate. As a result, the brush enclosure simultaneously allows different cleaning actions (e.g., scrubbing, chemical treatment, and rearrangement of bubbles within jammed foam) to be conducted on a surface area of the substrate.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for use in processing a substrate, comprising:
   a brush enclosure extending over a length, the brush enclosure configured to be disposed vertically over a horizontal surface of the substrate, the brush enclosure having an open region that is configured to be disposed in proximity to the horizontal surface of the substrate, the open region enabling foam from within the brush enclosure to contact the surface of the substrate when the substrate is present, the open region extending over the length of the brush enclosure;
   a first flange extending outward from the brush enclosure along the length and along a first side of the open region;
   a second flange extending from the brush enclosure along the length and along a second side of the open region, wherein a flat bottom surface of the first and second flange is substantially parallel to the horizontal surface of the substrate, wherein the first and the second flanges each have an opening extending therethrough, the opening connected to a vacuum source for removing fluid through the opening, the fluid present between the flat bottom surface and the horizontal surface of the substrate; and
   a brush disposed within the brush enclosure, the brush configured to deliver a fluid to the horizontal surface of the substrate through a conduit defined around an axis of the brush.

2. The apparatus of claim 1, wherein the flat bottom surface of the first and second flange is opposed to the substrate to form a gap through which the foam contacts both the substrate and the flat bottom surface.

3. The apparatus of claim 1, wherein the brush enclosure has a tubular shape.

4. The apparatus of claim 1, wherein the brush enclosure is defined from a chemically inert material.

5. The apparatus of claim 4, wherein the chemically inert material is defined by one or more of plastic, polyoxymethylene, polyvinylidene fluoride (PVDF), and polyethylene terepthalate (PET).

6. The apparatus of claim 1, wherein the length of the brush enclosure is configured to extend a length of a brush.

7. A brush enclosure for use in processing a substrate, comprising:
   an elongated enclosure configured to enclose a brush, the elongated enclosure being configured to be disposed above a horizontal surface of the substrate, the elongated enclosure having opposite ends defining a length and having an open region along the length of the elongated enclosure, the open region configured to be disposed above the surface of the substrate enabling a surface of the brush when the brush is present to make contact with the surface of the substrate when the substrate is present;
   a flange along the length of the elongated enclosure extending radially outward from an outer surface of the elongated enclosure, the flange defining a flat bottom surface being substantially parallel to the horizontal surface of the substrate when the substrate is present, wherein the flange has a conduit connected to a vacuum source to remove liquid resulting from a gap defined between the surface of the flange and the surface of the substrate; and a brush disposed within the elongated enclosure, the brush configured to deliver a fluid to the horizontal surface of the substrate through a conduit defined around an axis of the brush.

8. The brush enclosure of claim 7, wherein the flat bottom surface of the first and second flange is opposed to the substrate to form a gap through which the foam contacts both the substrate and the flat bottom surface.

9. The brush enclosure of claim 8, wherein a space between the flat bottom surface of the flange and the surface of the substrate when the substrate is present defines a gap.

10. The brush enclosure of claim 9, wherein the gap has a dimension from about 0.1 mm to about 5 mm.

11. The brush enclosure of claim 7, wherein the elongated enclosure has a tubular shape.

12. The brush enclosure of claim 7, wherein the elongated enclosure is defined from a chemically inert material.

13. The brush enclosure of claim 12, wherein the chemically inert material is defined by one or more of plastic, polyoxymethylene, polyvinylidene fluoride (PVDF), and polyethylene terepthalate (PET).

14. The brush enclosure of claim 7, wherein the length of the brush enclosure is configured to extend a length of a brush.

15. The brush enclosure of claim 7, wherein the open region extends over the length of the elongated enclosure.

16. A substrate cleaning system, comprising:
a first brush enclosure;
a first brush having a majority of an outer diameter of the first brush enclosed within the first brush enclosure, the first brush being configured to be disposed vertically above a top surface of a substrate so that the first brush contacts the substrate through an open region at a bottom of the first brush enclosure;
a first drive roller;
a second drive roller, the first and second drive rollers being configured to receive an edge of the substrate to support and rotate the substrate when placed below the first partially enclosed brush;
a second brush enclosure;
a second brush having a majority of an outer diameter of the second brush enclosed within the second brush enclosure, the second brush and second brush enclosure disposed vertically below a bottom surface of the substrate so that the second brush contacts the substrate through an open region at a top of the first brush enclosure, wherein each of the brush enclosures include a corresponding flange along a length of each enclosure, the flange extending radially outward from an outer surface of each enclosure, the flange defining a flat bottom surface being substantially parallel to an opposing surface of the substrate when the substrate is present.

17. The substrate cleaning system of claim 16, further comprising:
a housing, the housing being configured to enclose the substrate cleaning system.

18. The substrate cleaning system of claim 16, wherein the first and second brushes are configured to deliver a fluid to the opposing surface of the substrate through a conduit defined around an axis of the respective brushes.

19. The substrate cleaning system of claim 16, wherein each flange has an opening extending therethrough, the opening connected to a vacuum source for removing fluid through the opening, the fluid present between the flat bottom surface and the opposing surface of the substrate.

* * * * *